(12) United States Patent
Kaplan

(10) Patent No.: US 7,928,877 B1
(45) Date of Patent: Apr. 19, 2011

(54) CONTINUOUS-TIME DELTA-SIGMA MODULATOR WITH SMALL DISTRIBUTED RESONATORS

(75) Inventor: Todd Kaplan, Grass Valley, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/178,536

(22) Filed: Jul. 23, 2008

(51) Int. Cl.
*H03M 3/00* (2006.01)

(52) U.S. Cl. .......... 341/143; 341/144

(58) Field of Classification Search .......... 341/143, 341/144, 145
See application file for complete search history.

(56) References Cited

U.S. PATENT DOCUMENTS

| | | | |
|---|---|---|---|
| 5,172,085 A * | 12/1992 | Glenat et al. | 333/222 |
| 5,801,605 A * | 9/1998 | Filakovsky | 333/203 |
| 5,949,311 A * | 9/1999 | Weiss et al. | 333/202 |
| 5,986,525 A * | 11/1999 | Sasaki et al. | 333/203 |
| 6,157,329 A * | 12/2000 | Lee et al. | 341/133 |
| 6,791,433 B1 * | 9/2004 | Duerig et al. | 333/132 |
| 7,057,541 B1 | 6/2006 | Kaplan | 341/143 |
| 7,215,214 B1 * | 5/2007 | Taheri et al. | 331/107 A |

OTHER PUBLICATIONS

Kaplan, T. S., et al., "Continuous-Time ΔΣ Modulators Using Distributed Resonators," *IEEE Transactions on Circuits and Systems*, vol. 52, No. 11, pp. 2397-2403 (Nov. 2005).

Hernandez, L., et al., "*Sixth*-order programmable bandwidth bandpass sigma-delta modulator implemented with transmission lines," *Electronics Letters*, vol. 40, No. 25, pp. 1575-1576 (Dec. 9, 2004).

Hernandez, L., et al., "A Jitter Insensitive Continuous-Time ΔΣ Modulator Using Transmission Lines," *Proceedings of the 11th International Conference on Electronics, Circuits, and Systems*, pp. 109-112 (2004).

\* cited by examiner

*Primary Examiner* — Brian Young
(74) *Attorney, Agent, or Firm* — Ladas & Parry

(57) ABSTRACT

A continuous time delta-sigma modulator having a sampling frequency includes a distributed resonator having a length about equal to a reciprocal of an integer times a velocity of a signal in the distributed resonator divided by twice the sampling frequency of the continuous time delta-sigma modulator.

24 Claims, 5 Drawing Sheets

PROVIDING A DISTRIBUTED RESONATOR IN THE CONTINUOUS TIME DELTA-SIGMA MODULATOR, THE DISTRIBUTED RESONATOR HAVING A LENGTH ABOUT EQUAL TO A RECIPROCAL OF AN INTEGER TIMES A VELOCITY OF A SIGNAL IN THE DISTRIBUTED RESONATOR DIVIDED BY TWICE THE SAMPLING FREQUENCY OF THE CONTINUOUS TIME DELTA-SIGMA MODULATOR.

CONTINUOUS-TIME DELTA-SIGMA MODULATOR WITH SMALL DISTRIBUTED RESONATORS

TECHNICAL FIELD

This disclosure relates to continuous-time delta sigma modulators and in particular to continuous-time delta sigma modulators with distributed resonators.

BACKGROUND

U.S. Pat. No. 7,057,741 to Kaplan, issued Jun. 6, 2006 described a Delta-Sigma Modulator Using LC Resonators. In "Continuous-Time ΔΣ Modulator Using Distributed Resonators", Todd Kaplan and Joseph Jensen, IEEE Transactions on Circuits and Systems, Vol. 52, No. 11, November 2005, hereinafter "CT-ΔΣM Using Distributed Resonators", which is incorporated herein by reference, the authors describe a method for using distributed resonators in delta sigma (ΔΣ) modulators. Distributed resonators are shown to provide a greater dynamic range for a continuous-time delta sigma modulator (CT-ΔΣM) compared to LC resonators, because LC resonators have Q factors around 10, whereas distributed resonators can have Q factors in the hundreds and the dynamic range of a CT-ΔΣM increases with higher Q. A higher Q indicates a lower rate of energy dissipation relative to the oscillation frequency, which is advantageous. A distributed resonator can be a transmission line or can be a transverse electromagnetic (TEM) resonator.

An example CT-ΔΣM circuit 10 with a distributed resonator 16 according to the prior art is shown in FIG. 1. The signal 12 is input to transconductor 14 and the transconductor output 15 is connected to distributed resonator 16, which has an impedance $Z_0$ and a propagation delay through the distributed resonator 16 of δT, where T is the sampling period, which is the time between samples. The circuit components in the CT-ΔΣM, including transconductor 14, amplifier 18, adder 20, quantizer 22, delay 24, and digital to analog converters 26 and 28 are not the subject of this disclosure so are not further discussed. However, the operation of these components in a CT-ΔΣM circuit are well known to those skilled in the art of CT-ΔΣM circuits.

In FIG. 1, δT is the propagation delay across distributed resonator 16 with length L from first end 17 to second end 19 and T is the sampling period. The input impedance Zin is given as:

$$Z_{in}(s)=jZ_0 \tan(\omega \delta T)=Z_0(1-e^{-2s\delta T})/(1+e^{-2s\delta T})$$
(Grounded)

$$Z_{in}(s)=jZ_0 \cot(\omega \delta T)=Z_0(1+e^{-2s\delta T})/(1-e^{-2s\delta T}) \text{ (Open)}. \quad (1)$$

The distributed resonator 16 is grounded or shorted when second end 19 of the distributed resonator 16 is connected to ground or the two conductors in a transmission line are shorted together. The distributed resonator 16 is open when second end 19 of the distributed resonator 16 is open or floating and not connected to ground.

For the grounded distributed resonator case, if the distributed resonator's fundamental resonance frequency is $f_0$, then there are additional resonances at $3f_0, 5f_0, 7f_0 \ldots$. If the feedback digital to analog converters 26 and 28 generate output components at these frequencies, the harmonics will resonate and influence the signal into the quantizer 22. At best, these harmonics create significant aliases. If $F_s$ is the sampling frequency, $f_n$ is the nth harmonic frequency, and $k_n = \text{mod}(f_n, F_s)$, then the alias frequencies after sampling are given as $$a_n = \begin{cases} k_n, & k_n < F_S/2 \\ F_S/2 - k_n, & k_n \geq F_S/2 \end{cases} \quad (2)$$

These aliases can severely degrade the signal to noise ratio (SNR) or cause the modulator to go unstable. One solution to this is to decrease the high frequency components by slowing the digital to analog converters 26 and 28 down. However, this increases the likelihood of inter sample interference, because the digital to analog converters 26 and 28 may not fully settle by the time they need to switch again.

In "CT-ΔΣM Using Distributed Resonators", the authors present an example for a grounded distributed resonator 16. If $f_0$, the fundamental resonant frequency, is specified to be equal to Fs/4, where $F_s$ is the sampling frequency or equivalently the clock rate, then the resonant frequencies are then $F_s/4, 3F_s/4, 5F_s/4 \ldots$. Note that in this example the sampling rate is higher than the fundamental resonant frequency.

In "CT-ΔΣM Using Distributed Resonators", the authors describe that if $$2\delta = m, \text{ where m is a positive integer} \quad (3)$$

and letting $z=e^{sT}$, then equation (1) above can be expressed as:

$$Z_{T-line}(z)=Z_0(1-z^{-m})/(1+z^{-m}) \text{ (Grounded)}$$

$$Z_{T-line}(z)=Z_0(1+z^{-m})/(1-z^{-m}) \text{ (Open)} \quad (4)$$

Thus the authors teach that although the distributed resonator 16 operates in continuous time, the restriction that 2δ=m, where m is a positive integer, causes the distributed resonator 16 to act much like a discrete-time resonator after sampling. Also if the distributed resonator 16 is the only component in a delta sigma modulator that normally needs to be represented in continuous time, then given the restriction that 2δ=m, where m is a positive integer, the entire delta sigma modulator has discrete time properties.

Table 1 shows the resonant frequencies after sampling for shorted or grounded distributed resonators and open distributed resonators for different positive integer values of m, in accordance with the prior art.

TABLE 1

Resonant Frequencies for Distributed Resonators with Positive Integer m Values

| m | Shorted/Grounded Resonator | Open Resonator |
|---|---|---|
| 1 | Fs/2, 3Fs/2, 5Fs/2 ... | 0, Fs, 2Fs, 3Fs ... |
| 2 | Fs/4, 3Fs/4, 5Fs/4 ... | 0, Fs/2, Fs, 3Fs/2 ... |
| 3 | Fs/6, Fs/2, 5Fs/6 ... | 0, Fs/3, 2Fs/3, Fs ... |
| 4 | Fs/8, 3Fs/8, 5Fs/8 ... | 0, Fs/4, Fs/2, 3Fs/4 ... |
|   | (1, 3, 5,) * Fs/(2 * m) | (0, 1, 2, 3) * Fs/m |

FIG. 2 shows one example of the resonant frequencies after sampling for an open distributed resonator 16, for m=1, in accordance with the prior art. The fundamental resonant frequency of the distributed resonator 16 is at $F_s$ Hz (reference number 44). After sampling at a rate of $F_s$ the aliases are shown to be at integer multiples of $F_s$. One resonant frequency is at 0 Hz (reference number 42) and the next resonant frequencies are at $2F_s$ (reference 46), $3F_s$ (reference 47), and so on.

A disadvantage of distributed resonators according to the prior art is that they can be quite bulky compared to the rest of the circuitry in a delta sigma modulator.

Other papers that discuss using distributed resonators and in particular transmission lines in delta sigma modulators include "Sixth-order programmable bandwidth sigma-delta modulator implemented with transmission lines", L. Hernandez, E. Prefasi and P. Rombouts, Electronic Letters, Dec. 9, 2004, Vol. 40, No. 25, and "A Jitter Insensitive Continuous-Time Delta-Sigma Modulator Using Transmission Lines", L. Hernandez, E. Prefasi, P. Rombouts, S. Paton, M. Garcia and C. Lopez, IEEE Proc. ICECS, pp 109-112 December 2004, which are incorporated herein by reference. In both of these papers the sampling frequency is high and the input signal is oversampled.

What is needed is a method of designing delta-sigma modulators that allows the distributed resonator to be a manageable size while at the same time reducing any aliased noise. Also, what is needed is a method of designing delta-sigma modulators using distributed resonators that does not require oversampling of the input signal. The embodiments of the present disclosure answer these and other needs.

SUMMARY

In a first embodiment disclosed herein, a continuous time delta-sigma modulator having a sampling frequency includes a distributed resonator having a length about equal to a reciprocal of an integer times a velocity of a signal in the distributed resonator divided by twice the sampling frequency of the continuous time delta-sigma modulator.

In another embodiment disclosed herein, a method for providing a continuous time delta-sigma modulator having a sampling frequency includes providing a distributed resonator in the continuous time delta-sigma modulator, the distributed resonator having a length about equal to a reciprocal of an integer times a velocity of a signal in the distributed resonator divided by twice the sampling frequency of the continuous time delta-sigma modulator.

In another embodiment disclosed herein, a continuous time delta-sigma modulator having a sampling frequency comprises a transmission line having a length about equal to a reciprocal of an integer times a velocity of a signal in the transmission line divided by twice the sampling frequency of the continuous time delta-sigma modulator.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 5 is a flow chart of a method for providing a continuous-time sigma delta modulator with a distributed resonator in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
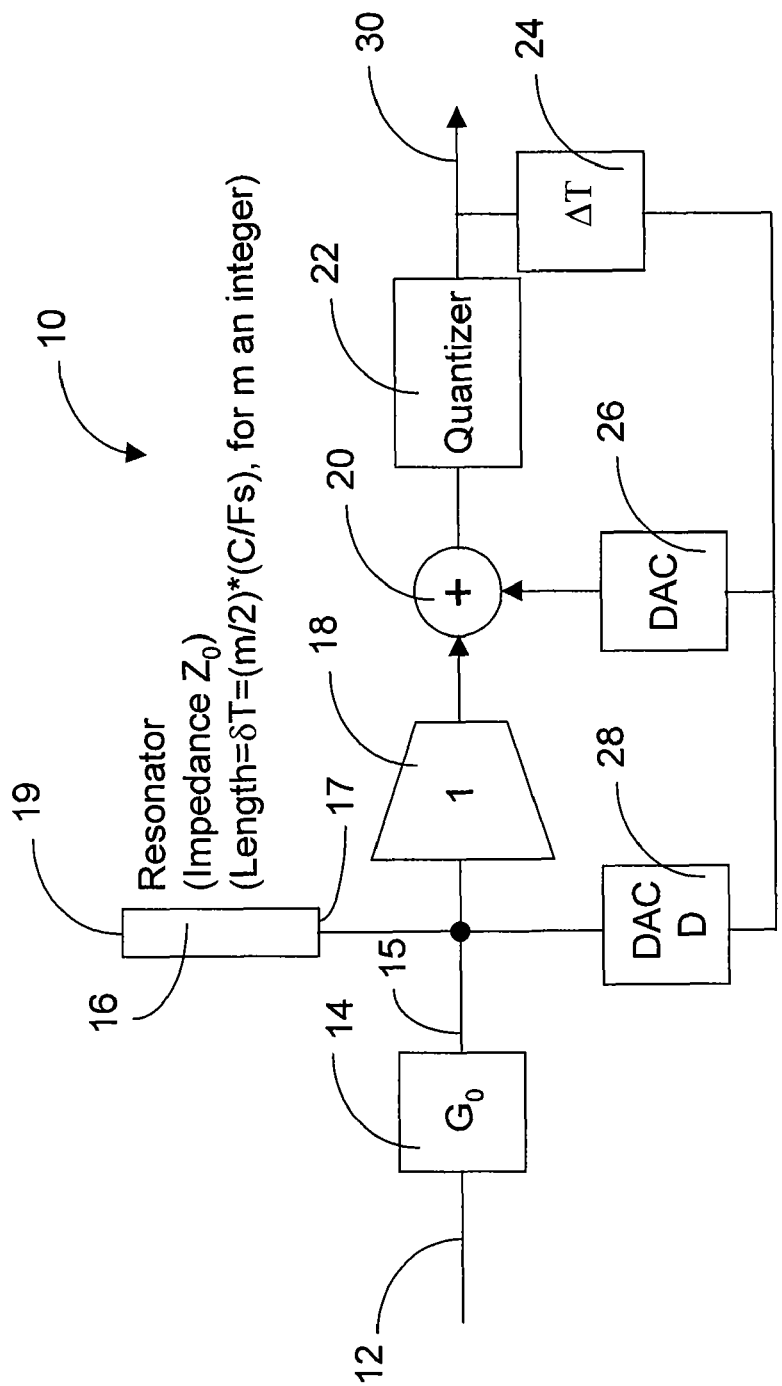
FIG. 1 is a continuous-time sigma delta modulator with a distributed resonator in accordance with the prior art.

Referring to FIG. 1, a continuous-time sigma delta modulator with a distributed resonator in accordance with the prior art is shown. Let the distributed resonator 16 have a length L with a corresponding propagation delay of $\delta T$ from first end 17 to second end 19, where T is the sample period of the delta-sigma modulator. Let the velocity of the signal in the distributed resonator 16 be C where C is proportional to the speed of light divided by the square root of the dielectric constant through the distributed resonator 16. Then from the prior art equation (3) $2\delta=m$ for m an integer, or $2\delta T=mT$, where T, the sampling period is equal to $1/F_s$, or the reciprocal of the sample frequency. The propagation delay $\delta T$ equals the length L of the distributed resonator 16 from first end 17 to second end 19 divided by the velocity C of the signal in the distributed resonator 16, which can be expressed as $\delta T=L/C$. Thus the length L of the distributed resonator 16 in accordance with the prior art is: $L=(m/2)*(C/F_s)$ or equivalently $L=(m/2)*(CT)$, for m an integer.

For example, if the dielectric constant is about 9, then C equals the speed of light ($3\times10^8$ m/sec) divided by the square root of 9, or $C=1\times10^8$ m/sec. For an $F_s$ of 4 GHz, then the minimum length of the distributed resonator 16 of the prior art for m=1 is 12.5 millimeters, which is quite bulky with respect to the other circuitry shown in FIG. 1.

To avoid aliasing in the prior art, m may be set to a higher number so that the delta sigma modulator is oversampling. However, this has the disadvantage of making the distributed resonator 16 even larger. For example, an m of 4 would result for this example in a distributed resonator 16 with a length of 50 millimeters.

Another approach in the prior art to reduce the distributor resonator 16 length is to increase the sample frequency $F_s$ to oversample the input signal; however, this becomes impractical beyond a certain point and requires more computations to be performed by any processor following the data conversion.

Figure 3:
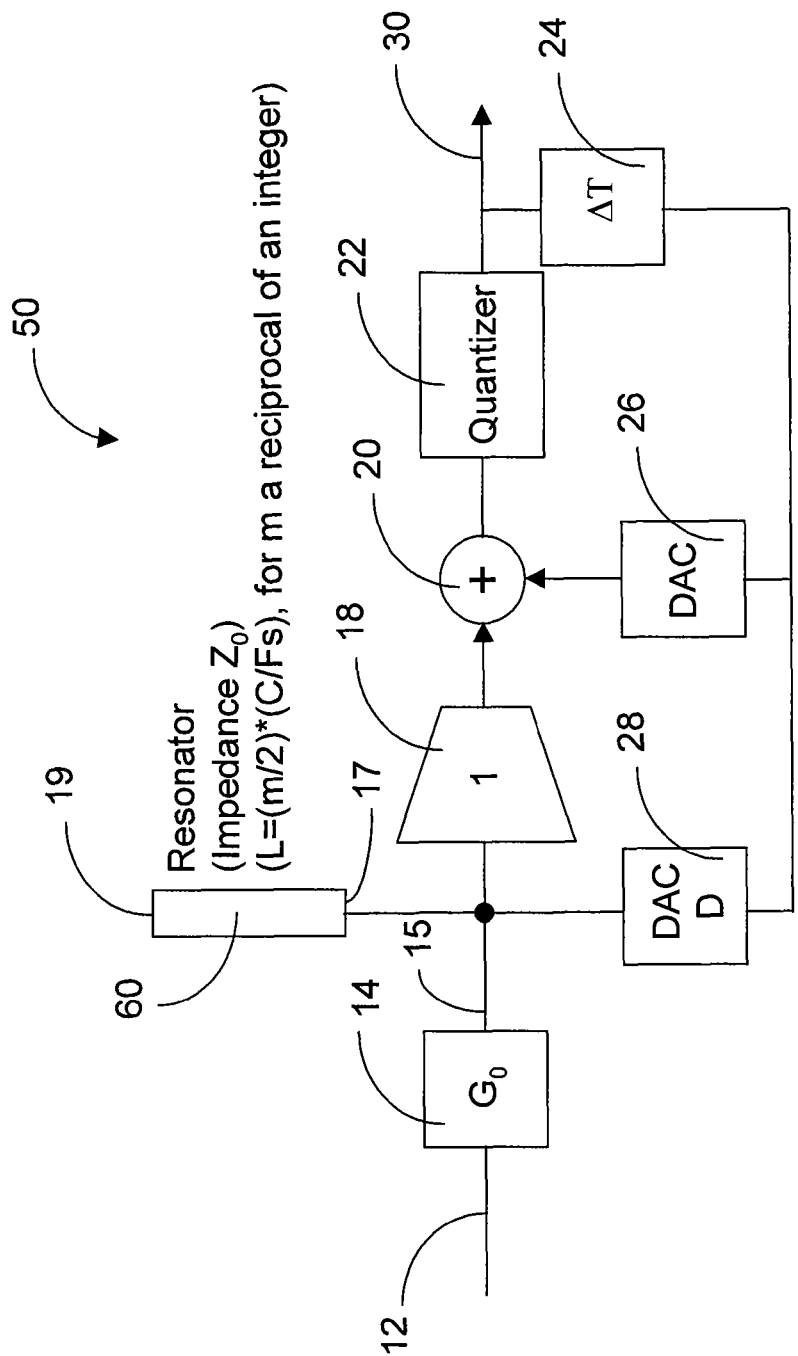
FIG. 3 is a continuous-time sigma delta modulator with a distributed resonator in accordance with the present disclosure.

FIG. 3 is a continuous-time sigma delta modulator 50 using a distributed resonator 60 in accordance with the present disclosure. For the continuous-time sigma delta modulator 50 shown in FIG. 3 the length L of the distributed resonator 60 is:

L=(m/2)*(C/Fs), for m a reciprocal of an integer.

By selecting the value of m to be the reciprocal of an integer number, in contrast to the prior art which required m to be a positive integer, the length L of the distributed resonator 60 can be reduced.

For example, if the dielectric constant is about 9, $F_s=4$ GHz, and m=¼, the length of the distributed resonator 60 is 3.125 millimeters, which is much less bulky than the 12.5 millimeters required as described in the example above for the prior art. It should be understood that this is only one example and various length distributed resonators can be used with delta sigma modulators in accordance with the present disclosure.

Table 2 shows the resonant frequencies for grounded distributed resonators and open distributed resonators for some example values of m, where m is a reciprocal of an integer in accordance with the present disclosure.

TABLE 2

Resonant Frequencies for Distributed Resonators According to Disclosure

| m | Shorted/Grounded Resonator | Open Resonator |
|---|---|---|
| 1/2 | Fs, 3Fs, 5Fs ... | 0, 2Fs, 4Fs, 6Fs ... |
| 1/3 | 3Fs/2, 9Fs/2, 15Fs/2 ... | 0, 3Fs, 6Fs, 9Fs/2 ... |
| 1/4 | 2Fs, 6Fs, 10Fs ... | 0, 4Fs, 8Fs, 12Fs ... |
| 1/5 | 5Fs/2, 15Fs/2, 25Fs/2 ... | 0, 5Fs, 10Fs, 15Fs ... |

Figure 4:
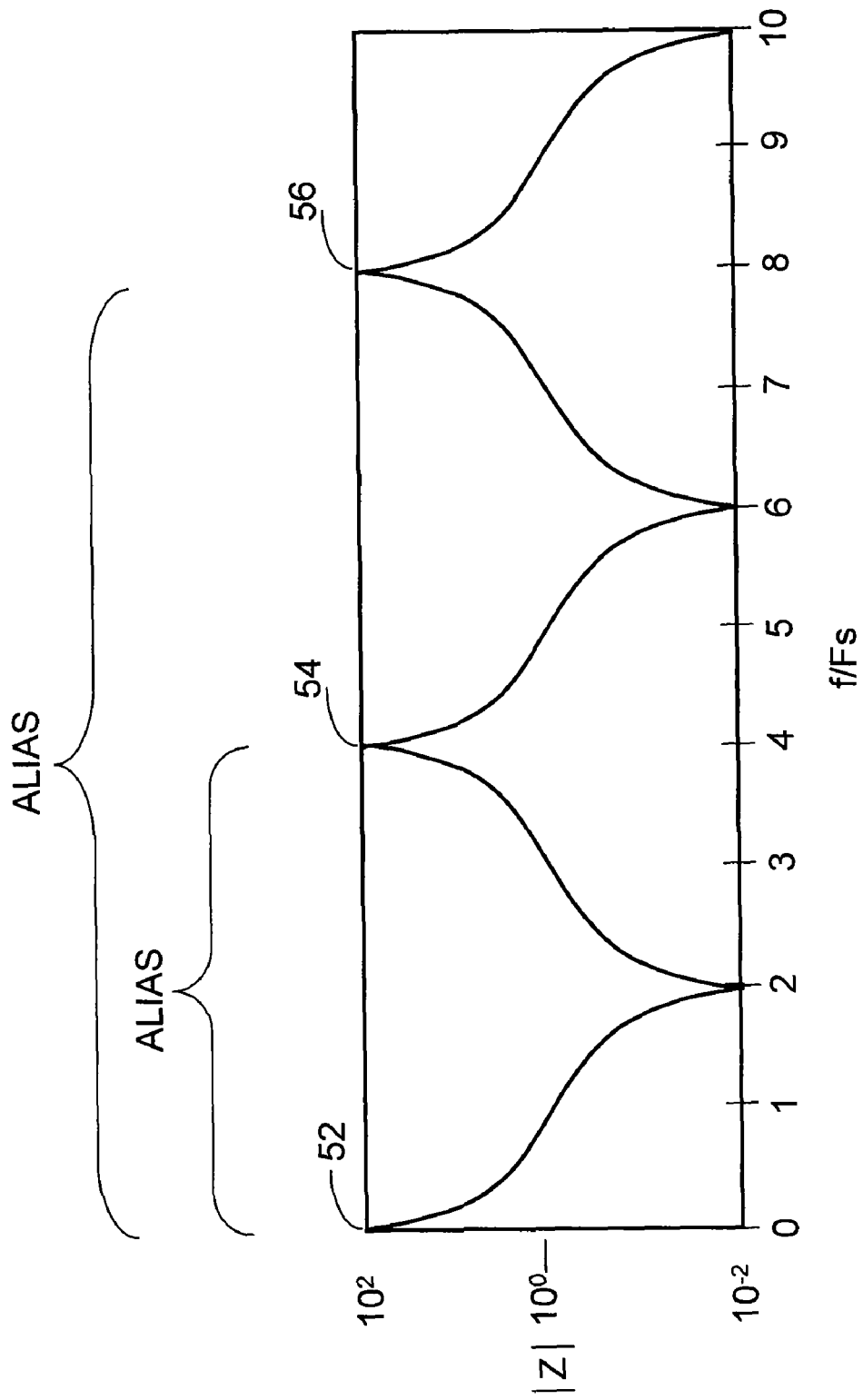
FIG. 4 shows the resonant frequencies for an open distributed resonator showing aliases after sampling in accordance with the present disclosure.

FIG. 4 shows an example of the resonant frequencies after sampling for a distributed resonator 60 according to the present disclosure. In FIG. 4 the fundamental resonant frequency of the distributed resonator 60 is 4Fs (reference number 54). For example, for m=¼ and Fs=4 GHz, the fundamental resonant frequency of open distributed resonator 60 is 16 GHz, which is 4Fs. After sampling the aliases of the fundamental resonant frequency 54 are shown to be at 0 Hz (reference number 52), 8Fs (reference number 56), 12Fs (not shown, and so on. The transfer function of the distributed resonator 60 may no longer alias perfectly into the baseband, creating unwanted aliases. However, the signal is substantially attenuated for any frequencies away from the fundamental resonant frequency (reference number 52), so the non-ideal aliasing is not that disadvantageous, as long as the peaks of the resonant frequencies alias correctly.

Figure 2:
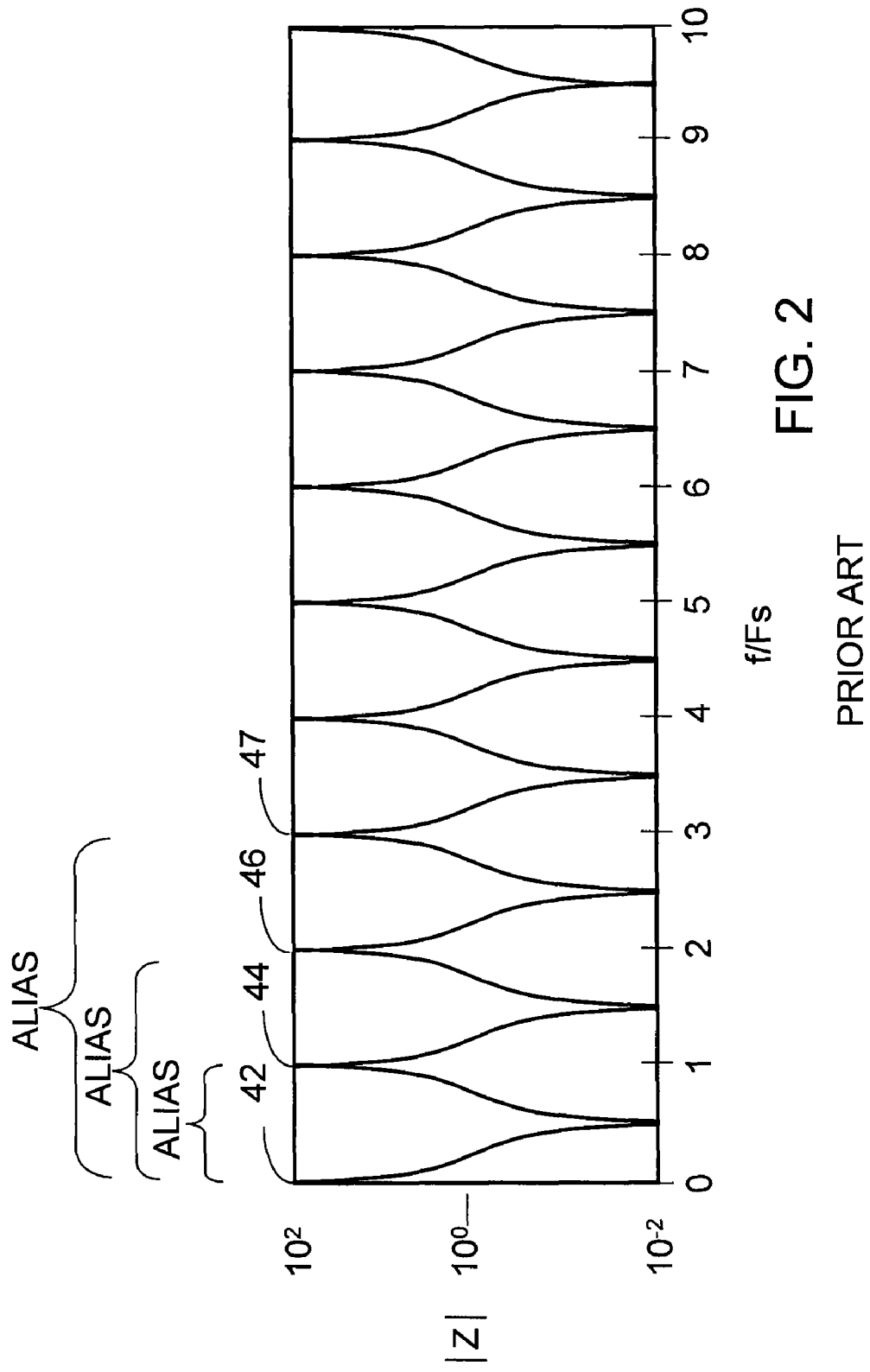
FIG. 2 shows the resonant frequencies for an open distributed resonator showing aliases after sampling in accordance with the prior art.

Consider a signal at $f=4*F_s$. For the prior art embodiment of FIG. 2, all the noise at $F_s$, $2F_s$, $3F_s$, $4F_s$ ... is aliased inband with the signal. However, with the distributed resonator 60 with the fundamental resonant frequency 54, shown in FIG. 4, all the noise at $F_s$, $2F_s$, $3F_s$ ... is attenuated. Thus, even though noise at $4F_s$ in FIG. 4 is aliased inband with the signal, less noise overall is aliased inband.

A delta-sigma modulator according to the present disclosure was simulated. A signal with a frequency close to 16 GHz was fed into a simulated delta-sigma modulator with a sampling frequency of 4 GHz. The distributed resonator 60 used in the simulated delta-sigma modulator was an open distributed resonator 60 with a fundamental resonant frequency of 16 GHz. The resonant frequencies after sampling were at 0, $4F_s$, $8F_s$ ..., as shown in FIG. 4. The test results indicated that the delta-sigma modulator remained stable and the SNR was 66 dB over a 10 MHz bandwidth.

FIG. 5 is a flow chart of a method for providing a continuous-time sigma delta modulator with a distributed resonator in accordance with the present disclosure. In step 100 a distributed resonator is provided in a continuous time delta-sigma modulator, the distributed resonator having a length about equal to a reciprocal of an integer times a velocity of a signal in the distributed resonator divided by twice the sampling frequency of the continuous time delta-sigma modulator Thus, the size of distributed resonators for delta-sigma modulators can be significantly reduced according to this disclosure, while retaining the advantages of distributed resonators over LC resonators.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for ..." and no method or process step herein is to be construed under those provisions unless the step, or steps, are expressly recited using the phrase "comprising the step(s) of ...."

What is claimed is:

1. A continuous time delta-sigma modulator having a sampling frequency, the continuous time delta-sigma modulator comprising:
   a distributed resonator having a length about equal to a reciprocal of an integer times a velocity of a signal in the distributed resonator divided by twice the sampling frequency of the continuous time delta-sigma modulator;
   wherein the integer is greater than one.

2. The continuous time delta-sigma modulator of claim 1 wherein the distributed resonator is a transmission line.

3. The continuous time delta-sigma modulator of claim 2 wherein one end of the transmission line is open.

4. The continuous time delta-sigma modulator of claim 2 wherein one end of the transmission line is shorted or grounded.

5. The continuous time delta-sigma modulator of claim 1 wherein the distributed resonator is a transverse electromagnetic (TEM) resonator.

6. The continuous time delta-sigma modulator of claim 1 wherein the velocity of the signal in the distributed resonator is a function of a dielectric constant of the distributed resonator.

7. A method for providing a continuous time delta-sigma modulator having a sampling frequency, the method comprising:
   providing a distributed resonator in the continuous time delta-sigma modulator, the distributed resonator having a length about equal to a reciprocal of an integer times a velocity of a signal in the distributed resonator divided by twice the sampling frequency of the continuous time delta-sigma modulator;
   wherein the integer is greater than one.

8. The method of claim 7 wherein the distributed resonator is a transmission line.

9. The method of claim 8 wherein one end of the transmission line is open.

10. The method of claim 6 wherein one end of the transmission line is shorted or grounded.

11. The method of claim 7 wherein the distributed resonator is a transverse electromagnetic (TEM) resonator.

12. The method of claim 7 wherein the velocity of the signal in the distributed resonator is a function of a dielectric constant of the distributed resonator.

13. A continuous time delta-sigma modulator having a sampling frequency, the continuous time delta-sigma modulator comprising:
 a transmission line having a length about equal to a reciprocal of an integer times a velocity of a signal in the transmission line divided by twice the sampling frequency of the continuous time delta-sigma modulator;
 wherein the integer is greater than one.

14. The continuous time delta-sigma modulator of claim 13 wherein one end of the transmission line is open.

15. The continuous time delta-sigma modulator of claim 13 wherein one end of the transmission line is grounded.

16. The continuous time delta-sigma modulator of claim 13 wherein one end of the transmission line is shorted.

17. The continuous time delta-sigma modulator of claim 13 wherein the velocity of the signal in the transmission line is a function of a dielectric constant of the transmission line.

18. A continuous time delta-sigma modulator having a sampling frequency, the continuous time delta-sigma modulator comprising:
 a transmission line having a length equal to a reciprocal of an integer times one-half a velocity of a signal in the transmission line divided by a desired resonance frequency;
 wherein the integer is greater than one.

19. The continuous time delta-sigma modulator of claim 18 wherein one end of the transmission line is open.

20. The continuous time delta-sigma modulator of claim 18 wherein one end of the transmission line is grounded.

21. A resonator comprising:
 a transmission line having a length equal to a reciprocal of an integer times one-half a velocity of a signal in the transmission line divided by a desired resonance frequency;
 wherein the integer is greater than one; and
 wherein a velocity of a signal in the transmission line is a function of a dielectric constant of the transmission line.

22. A continuous time delta-sigma modulator having a sampling frequency, the continuous time delta-sigma modulator comprising:
 a distributed resonator having a length equal to a reciprocal of an integer times one-half a velocity of a signal in the distributed resonator divided by a desired resonance frequency;
 wherein the integer is greater than one.

23. The continuous time delta-sigma modulator of claim 22 wherein one end of the distributed resonator is open.

24. The continuous time delta-sigma modulator of claim 22 wherein one end of the distributed resonator is grounded.

* * * * *